United States Patent [19]

Horie et al.

[11] Patent Number: 4,644,240

[45] Date of Patent: Feb. 17, 1987

[54] METHOD AND APPARATUS FOR CONTROLLING REVERSE-CONDUCTING GTO THYRISTOR

[75] Inventors: Akira Horie; Takashi Tsuboi, both of Katsuta, Japan

[73] Assignee: Hitachi, Ltd., Tokyo, Japan

[21] Appl. No.: 624,372

[22] Filed: Jun. 25, 1984

[30] Foreign Application Priority Data

Jun. 27, 1983 [JP] Japan .................................. 58-115484

[51] Int. Cl.[4] ............................................ H03K 17/51
[52] U.S. Cl. ............................... 318/768; 307/252 C; 363/57; 363/96; 363/137
[58] Field of Search .................... 363/56, 57, 96, 1.37; 307/252 C; 318/767, 768

[56] References Cited

U.S. PATENT DOCUMENTS

| | | | |
|---|---|---|---|
| 4,016,391 | 4/1977 | Kiuchi et al. | 307/252 C |
| 4,308,578 | 12/1981 | Tamura et al. | 307/252 C |
| 4,392,175 | 7/1983 | Takigami et al. | 307/252 C |

OTHER PUBLICATIONS

T. Yatsuo et al., "A Diode Integrated High Speed Thyristor", Proc. 2nd Conf. on Solid State Devices, 1970.

Primary Examiner—Clifford C. Shaw
Attorney, Agent, or Firm—Antonelli, Terry & Wands

[57] ABSTRACT

A reverse-conducting GTO thyristor comprises a gate turn-off thyristor and a diode which are formed on a single semiconductor substrate so as to have a common layer and be connected electrically in an inverse-parallel connection. A power converter is composed of a plurality of pairs of these reverse-conducting GTO thyristors connected in series, each pair of thyristors being controlled so that they are turned on and off in opposite phases. An OFF gate pulse for one of each pair of thyristors continues from a time on or after the generation of an ON gate pulse for the other thyristor to the time when a recovery current flowing through the diode portion of the first thyristor is extinguished. The thus-extended OFF gate pulse functions to prevent any displacement current flowing through the GTO portion of the first thyristor during the recovery time for the diode portion thereof.

9 Claims, 6 Drawing Figures

4,644,240

METHOD AND APPARATUS FOR CONTROLLING REVERSE-CONDUCTING GTO THYRISTOR

BACKGROUND OF THE INVENTION (Field of the Invention)

The present invention relates to a method and apparatus for controlling a reverse-conducting GTO device in which a gate turn-off (GTO) thyristor and a diode of opposite polarities formed on a single semiconductor substrate are connected in parallel.

In AC-DC, DC-AC, DC-DC or AC-AC/power converters which use a number of thyristors or gate turn-off thyristors, a freewheeling diode is often connected to each thyristor in an inverse parallel relationship.

It is therefore known, when using a thyristor to form an inverse-parallel unit of a thyristor and diode integrally on a single semiconductor substrate, to reduce the size of the entire device. For example, a semiconductor device in which a thyristor and diode are formed integrally is disclosed in the Proceedings of the 2nd Conference on Solid State Devices, Tokyo, 1970, Supplement to the Journal of the Japan Society of Applied Physics, Vol. 40, 1971. It is also practicable to form a reverse-conducting GTO thyristor when using a GTO thyristor and diode.

However, such a reverse-conducting GTO thyristor has the problem that, while the diode portion thereof recovers its ability to block reverse voltage, the GTO thyristor could undergo erroneous breakover, and this could destroy its emitter.

(SUMMARY OF THE INVENTION)

An object of the present invention is to provide a control method which can prevent erroneous breakover of the GTO portion of a reverse-conducting GTO thyristor which can occur while the diode portion of the GTO thyristor recovers.

According to an aspect of the present invention, when controlling a reverse-conducting GTO thyristor comprising a gate turn-off thyristor and a diode formed on a single semiconductor substrate so as to have a common layer and be connected electrically in an inverse-parallel connection, a reverse bias voltage is applied between the gate and cathode of the gate turn-off thyristor during a decay phase in which a reverse current flowing through the diode is decrasing.

Thus, it becomes possible to block a displacement current flowing between the gate and cathode of the GTO thyristor, and hence prevent erroneous breakover of the GTO thyristor portion.

BRIEF DESCRIPTION OF THE DRAWINGS

FIG. 1(A) illustrates a section through one example of a reverse-conducting GTO thyristor used in the present invention; while

DETAILED DESCRIPTION OF THE INVENTION

Figure 1A:
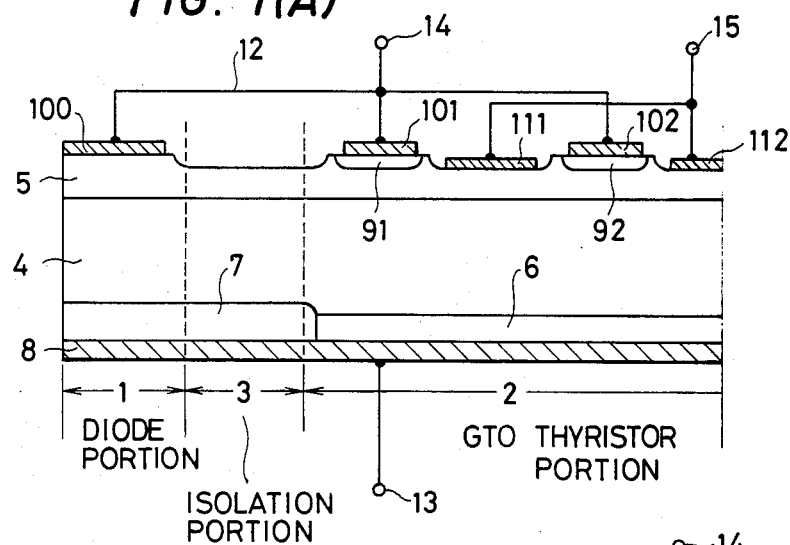
Figure 1B:
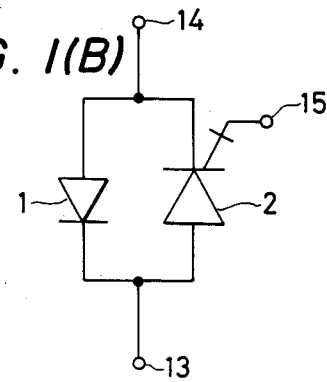
FIG. 1(B) shows the circuit of FIG. 1(A) schematically.

FIG. 1 illustrates the configuration of a reverse-conducting GTO thyristor, in which FIG. 1(A) is a section schematic there through and FIG. 1(B) is an equivalent electric circuit.

As shown, the GTO thyristor is composed of a diode portion 1, a GTO thyristor portion 2, and an isolation portion 3 which isolates the diode portion 1 from the GTO thyristor portion 2. The diode portion 1 and the GTO thyristor portion 2 share between them a first base layer 4 and a second base layer 5 which are adjacent to each other. The first base layer 4 in the GTO thyristor portion 2 is underlain by a first emitter layer 6, and the first base layer 4 in the diode portion 1 and the isolation portion 3 is underlain by an electrical contact layer 7 of a high impurity density. The first emitter layer 6 and the electrical contact layer 7 are both connected to a first electrode 8. The electrical contact layer 7 is provided to improve the electrical contact with the first electrode 8. Second emitter layers 91, 92 . . . which are provided with second electrodes 101, 102 . . . on surfaces thereof, are provided in parts of the surface of the second base layer 5 in the GTO thyristor portion 2. Other parts of the surface of the second base layer 5 in the GTO thyristor portion 2 are provided with gate electrodes 111, 112 . . . A second electrode 100 in the diode portion 1 is connected to the second electrodes 101, 102 . . . in the GTO thyristor portion 2 by a lead-out wire 12. The first electrode 8 in the diode portion 1 functions as a diode cathode, and the second electrode 100 thereof as a diode anode. The first electrode 8 in the GTO thyristor portion 2 functions as a GTO anode, and the second electrodes 101, 102 . . . thereof as GTO cathodes.

The reverse-conducting GTO thyristor thus constructed has both the well-known GTO function, by which it makes the GTO thyristor portion 2 conductive (turns it on) by supplying a current from the gate electrodes 111, 112 . . . to the second electrodes #(i.e., the GTO cathodes) 101, 102 . . . , and makes the GTO thyristor portion 2 nonconductive (turn it off) by supplying a current from the second electrodes (i.e. the GTO cathodes) 10 to the gate electrodes 111,112 . . . , as well as a function by which it keeps the diode portion 1 conductive (turns it on) at all times in the direction from the second electrode 100 to the first electrode 8.

Numeral 13 denotes a GTO anode terminal which also functions as a diode cathode terminal, 14 denotes a GTO cathode terminal which also functions as a diode anode terminal, and 15 denotes a GTO gate terminal.

Figure 2:
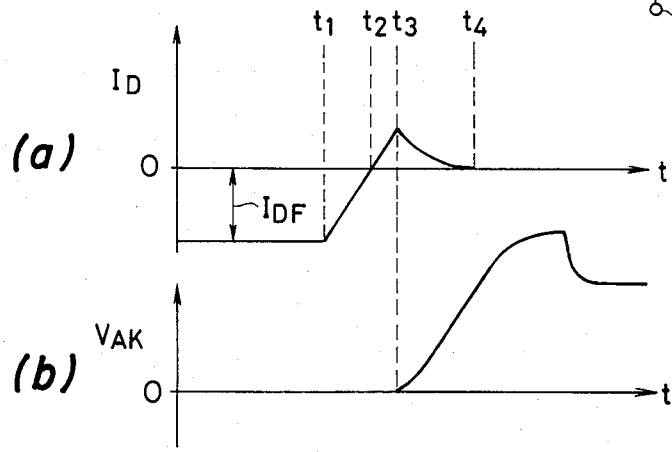
FIG. 2 illustrates variations in diode current and anode-cathode voltage of the GTO portion while the diode portion of the GTO thyristor recovers.

In the reverse-conducting GTO device of this construction, it is conceivable that forward breakover of the GTO thyristor portion 2 could occur erroneously when the voltage applied between the first electrode 8 and the electrodes 101, 102 . . . in the GTO thyristor portion 2 is switched from the reverse direction to the forward direction, this would destroy the emitters 91, 92 . . . in the GTO thyristor portion 2. This will now be explained with reference to FIG. 2. FIG. 2(a) shows a diode current $I_D$ flowing through the diode portion 1 plotted against time, and FIG. 2(b) shows a voltage $V_{AK}$ between the first electrode 8 and the second electrodes 101, 102 . . . plotted against time.

When a circuit voltage is applied in the direction such that terminal 14 is positive and terminal 13 is negative, a forward current $I_{DF}$ flows through the diode portion 1 in the period prior to a time $t_1$, as shown in FIG. 2(a). If the circuit voltage is reversed at time $t_1$ so that terminal 13 is positive and terminal 14 negative, the forward current flowing through the diode portion 1 decreases rapidly and then reverses at a time $t_2$. The reverse current flowing through the diode portion 1 continues to increase until a time $t_3$ at which the diode portion 1 starts to recover its ability to block reverse voltage. In other words, when an anode-cathode voltage $V_{AK}$ in the GTO thyristor portion 2 starts to appear, the reverse current in the diode portion 1 starts to decrease. Subsequently, the reverse current in the diode portion becomes zero at a time $t_4$. The anode-cathode voltage $V_{AK}$ of the GTO portion 2 is increasing at this time, but then stabilizes at the level of the circuit voltage applied between the terminals 13 and 14, as shown in FIG. 2(b).

The reverse current flowing through the diode portion during the period between $t_2$ and $t_4$ is called the recovery current, and the period from time $t_3$ at which the diode portion 1 starts to recover its ability to block reverse voltage to time $t_4$ at which the recovery current becomes zero is called the decay phase.

If the forward current $I_{DF}$ flowing through the diode portion 1 prior to time $t_1$ is increased, the reverse current during the period between $t_2$ and $t_4$ increases proportionally. In particular, the rise rate $dV_{AK}/dt$ of the voltage $V_{AK}$ increases according to the magnitude of the reverse current at time $t_3$. If the rate $dV_{AK}/dt$ reaches a certain value, forward breakover of the GTO thyristor portion 2 occurs erroneously. The rate $dV_{AK}/dt$ that will produce erroneous breakover of a reverse-conducting GTO thyristor has a much lower value than the erroneous breakover-proof value of $dV_{AK}/dt$ of an ordinary single GTO thyristor. With an ordinary single GTO thyristor, it is known to improve the erroneous breakover-proof value of $dV_{AK}/dt$ by connecting a capacitor or resistor between the gate electrode and the cathode electrode, and by supplying a displacement current produced by $dV_{AK}/dt$ to the gate electrode, bypassing the emitter layers. Since the displacement current in a reverse-conducting GTO thyristor is much larger (about ten times) than that in a single GTO thyristor, the displacement current will also flow from the diode portion 1 through the first base layer 4 into the GTO portion 2.

With this in mind, the erroneous breakover-proof value of $dV_{AK}/dt$ can be improved to some extent by either increasing the width of the isolation portion 3, or by reducing the lifetime of the minority carriers in the first base layer 4. Despite this, these methods are not preferred because they lead to an increase in the size of the elements and a reduction in the yield.

Figure 3:
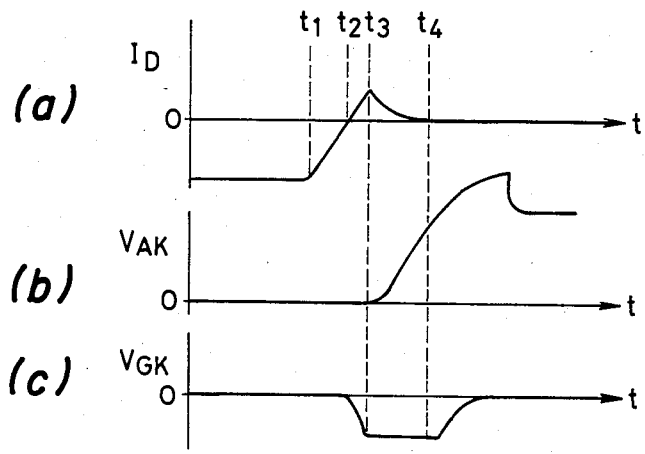
FIG. 3 illustrates one example of the gate-cathode reverse bias voltage according to the present invention.

FIG. 3 illustrates the principal control method of the present invention. A reverse bias voltage is applied between the gate terminal 15 and the cathode terminal 14 of the GTO thyristor portion 2 during the period $t_3$ to $t_4$ (i.e., the decay phase) in which the reverse current in the diode portion 1 is decreasing. As shown in FIG. 3(c), the gate-cathode voltage $V_{GK}$ is made to be negative during the decay phase $t_3-t_4$, by applying a voltage in the same direction as an OFF gate pulse for the GTO thyristor between the gate and thereof.

This can block the forward displacement current flowing between the gate and cathode, and hence can prevent erroneous breakover of the GTO thyristor portion 2.

In principle, it is sufficient to apply a reverse voltage across the gate and cathode ony during the decay phase $t_3-t_4$, but no adverse effect occurs if the reverse bias voltage is applied during the period $t_2-t_4$ in which the reverse current is flowing through the diode portion, or even during a longer time.

The present invention will be described in the following in connection with one specific embodiment in which it is applied to a DC-AC converter shown in FIG. 4. The converter shown in FIG. 4 is composed of reverse-conducting GTO thyristors 21 to 26 forming a three-phase bridge connection, and converts DC power supplied from a power supply 27 into desired AC power which is supplied to a load (e.g., an induction motor) 28.

The reverse-conducting GTO thyristors 21 and 22 form a pair and are controlled so that they are on and off in opposite phases. The reverse-conducting GTO thyristors 23 and 24, 25 and 26 form similar pairs, and the thyristors of each pair are controlled so that they are on and off in opposite phases. It is well known that these three pairs of thyristors are controlled so that there is a phase difference of 120 degrees electrical angle therebetween.

Figure 4:
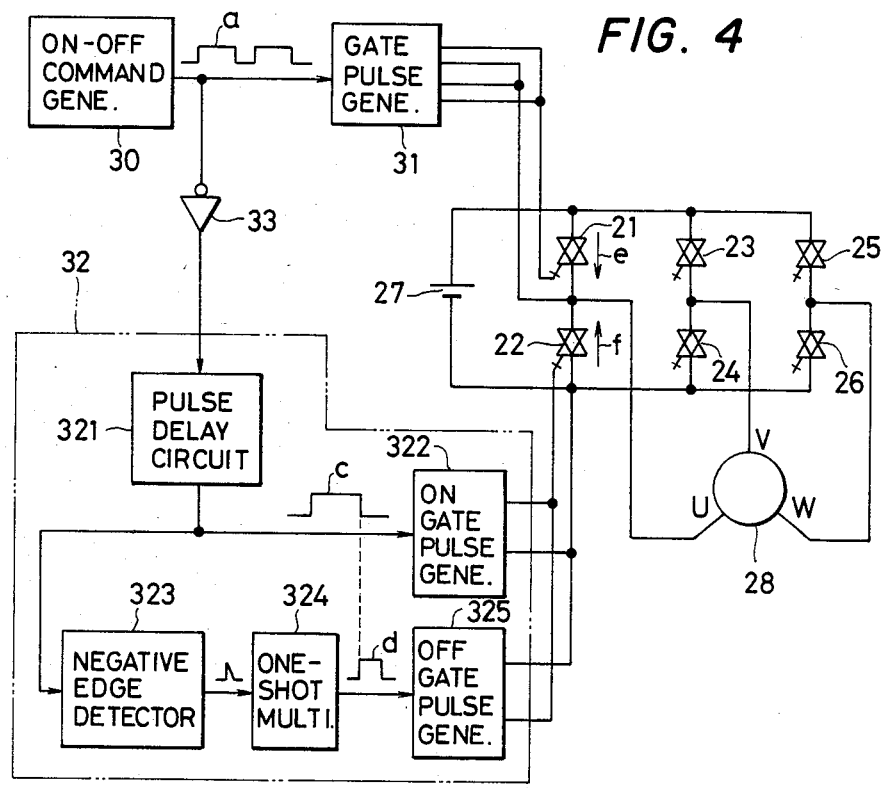
FIG. 4 is a block diagram of the configuration of a DC-AC power converter supplying a three-phase induction motor and a control unit for the converter, as one embodiment the present invention.

FIG. 4 illustrates control units for only the GTO thyristors 21 and 22 and it illustrates in detail only the control unit for the thyristor 22. An ON-OFF command generator 30 generates an ON-OFF command signal a for the pair of reverse-conducting GTO thyristors 21 and 22. This command signal a is a signal which can be either "high" or "low", when it is high, element 21 is turned on and element 22 off; and when it is low, element 21 is turned off and element 22 on.

The command signal a is input directly to a gate pulse generator 31 for the element 21. The gate pulse generator 31 has the same configuration as that of a gate pulse generator 32 which will be described below, and it supplies ON gate pulses as shown in FIG. 5(b) and OFF gate pulses (not shown) between the gate and cathode of the element 21.

The command signal a is also input to the gate pulse generator 32 for the element 22 through a sign inverter 33. The rise of each pulse is delayed by $t_d$ by a pulse delay circuit 321 in the pulse generator 32, so that an output signal c therefrom has the waveform as shown in FIG. 5(c). An ON gate pulse generator 322 supplies ON gate pulses between the gate and cathode of the reverse-conducting GTO thyristor 22 in synchronism with the signal c.

A negative edge detector 323 detects the fall of the signal c, and a one-shot multivibrator 324 generates a signal d which has a scheduled time width $t_{off}$ starting from the time at which the fall is detected. An OFF gate pulse generator 325 supplies OFF gate pulses across the cathode the gate of the reverse-conducting GTO thyristor 22 in accordance with the signal d.

Figure 5:
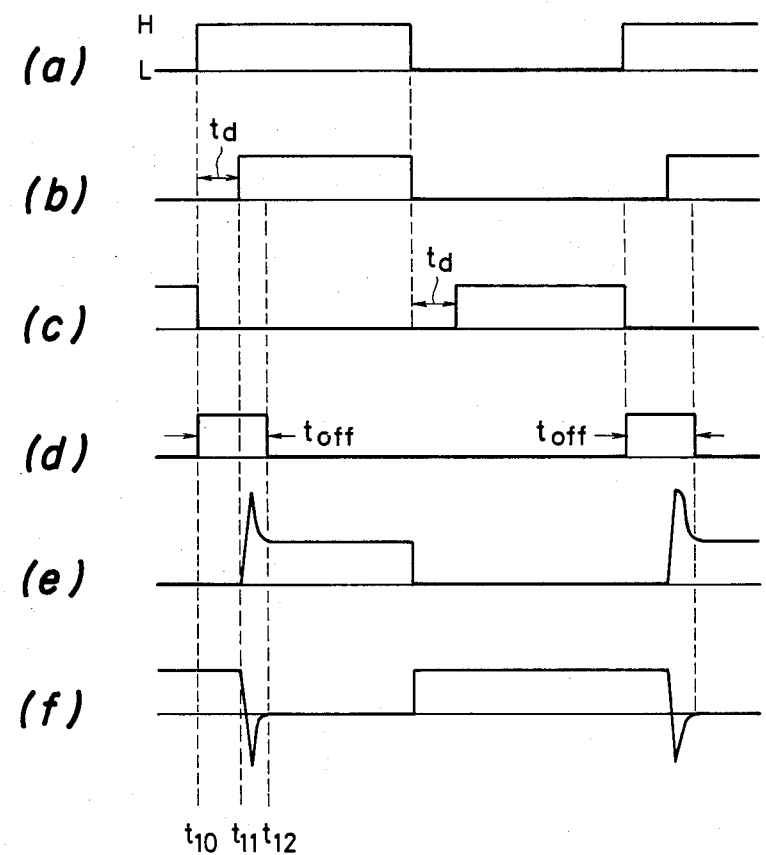
FIG. 5 illustrates the waveforms of voltages and current at various parts in the circuit of FIG. 4.

The method of controlling the converter thus constructed will now be described with reference to the timing chart of FIG. 5. FIG. 5 deals with the reverse-conducting GTO thyristor 21 of an upper U-phase arm and the reverse-conducting GTO thyristor 22 of a lower U-phase arm. FIG. 5(a) shows the command signal a, FIG. 5(b) shows the "on" signal of the reverse-conducting GTO thyristor 21, FIGS. 5(c) and (d) show the "on" signal c and the "off" signal d of the reverse-conducting GTO thyristor 22, respectively, FIG. 5(e) shows a GTO current e in the reverse-conducting GTO thyristor 21, and FIG. 5(f) shows a diode current f of the reverse-conducting GTO thyristor 22.

It is assumed that this DC-AC converter is under pulse width modulation (PWM) control. Therefore, even during the period in which the elements 21 and 24 are on and a voltage is applied between terminals U and V of the load 28 through a circuit which is composed of the power supply 27, the GTO portion of element 21, terminal U of the load 28, terminal V thereof, the GTO portion of element 24, to the power supply 27, the elements 21 and 22 are repeatedly turned on and off alternately to provide pulse width control. FIG. 5 shows the ON/OFF operating of the elements 21 and 22 during a short time under this condition. The GTO current e of FIG. 5(e) flows through the GTO portion of the element 21 in accordance with the "on" signal of FIG. 5(b), while no current flows through the GTO portion of the element 22 (not shown) and a freewheeling current (i.e., the diode current) f flows through the diode portion thereof, as shown in FIG. 5(f), during the period in which the GTO portion of the element 21 is off.

As a result of the turning off of the GTO portion of the reverse-conducting GTO thyristor 21, on or before a time $t_{10}$, as shown in FIG. 5, the freewheeling current f flows through a circuit which is composed of terminal V of the load 28, the GTO portion of the reverse-conducting GTO thyristor 24, the diode portion of the reverse-conducting GTO thyristor 24, and terminal U of the load 28. At time $t_{10}$, the "off" signal is supplied to turn OFF the reverse-conducting thyristor 22, but the freewheeling current f continues to flow through the diode portion.

If the GTO portions of both elements 21 and 22 are turned on simultaneously, the power supply would be short-circuited. To prevent this short-circuiting of the power supply, the "on" signal b for the element 21 is generated at a time $t_{11}$, delayed by a time $t_d$ from the "off" signal d for the element 22. When the reverse-conducting GTO thyristor 21 is turned on by this signal and the forward current flows through the GTO portion thereof, the diode current continues to flow through the reverse-conducting GTO thyristor 22 until it is cancelled by the forward current, so that a condition is produced in which the durability of the GTO portion of the reverse-conducting GTO thyristor 22 against erroneous breakover due to increased $dV_{AK}/dt$ is reduced.

In this embodiment, therefore, the one-shot multivibrator 324 ensures that the OFF gate pulse (i.e., the "off" signal) has a certain time width $t_{off}$ and continues continues until a time $t_{12}$. The period $t_{off}$ from $t_{10}$ to $t_{12}$ includes the decay phase and, during this period, OFF gate pulses corresponding to the reverse bias voltage continue to be applied between the gate and cathode of the reverse-conducting GTO thyristor 22. As a result, it is possible to prevent any displacement current passing through the reverse-conducting GTO thyristor 22, and hence prevent erroneous breakover and the consequent destruction thereof.

The present invention should not be limited to the DC-AC converter exemplified in the foregoing embodiment, but can be applied with similar effects to an AC-DC converter or the like under similar operating conditions.

According to the present invention, as has been described, while the diode portion of a reverse-conducting GTO thyristor recovers, a displacement current flowing through the GTO portion thereof can be blocked to prevent erroneous breakover of the GTO portion, so that the destruction of the element can be prevented.

We claim:

1. In a method of controlling a reverse-conducting GTO thyristor comprising a gate turn-off thyristor and a diode which are formed on a single semiconductor substrate so as to have a common layer and be connected electrically in an inverse-parallel connection, the improvement in that a reverse bias voltage is applied between the gate and cathode of said gate turn-off thyristor substantially only during a decay phase in which a reverse current flowing through said diode is decreasing.

2. In a method of controlling a reverse-conducting GTO thyristor comprising a gate turn-off thyristor and a diode which are formed on a single semiconductor substrate strate so as to have a common layer and be connected electrically in an inverse-parallel connection, the improvement in that a reverse bias voltage is applied between the gate and cathode of said gate turn-off thyristor substantially only during the period in which a reverse current is flowing through said diode.

3. A control device for a reverse-conducting GTO thyristor comprising:
a power converter provided with a plurality of pairs of reverse-conducting GTO thyristors;
control means which includes means adapted to apply an ON gate pulse to one thyristor of each of said pairs of reverse-conducting GTO thyristors after a lapse of time after starting to supply an OFF gate pulse to the other of said pair of thyristors necessary for said other of said pair of thyristors to turn off, and turn on and off each of said pairs of reverse-conducting GTO thyristors in opposite phases; and
means for continuing said OFF gate pulse until after the generation of said ON gate pulse applied to said one thyristor of each of said pairs of thyristors.

4. The control device for a reverse-conducting GTO thyristor according to claim 3, wherein said continuation means includes means for generating an OFF gate pulse of a scheduled time width from the time at which said ON gate pulse applied to the other of said pair of thyristors has been extinguished.

5. The control device for a reverse-conducting GTO thyristor according to claim 4, further comprising a one-shot multivibrator which is adapted to set said scheduled time width.

6. A control device for a reverse-conducting GTO thyristor comprising:
a power converter provided with a plurality of pairs of reverse-conducting GTO thyristors;
control means which includes means adapted to apply an ON gate pulse to one thyristor of each of said pairs of reverse-conducting GTO thyristors after a lapse of time after starting to supply an OFF gate pulse to the other thyristor of said pair of thyristors necessary for said other of said pair of thyristors to turn off, and turn on and off each of said pairs of reverse-conducting GTO thyristors in opposite phases; and
means for generating said ON gate pulse applied to said one thyristor of each of said pairs of thyristors as a pulse which starts before said OFF gate pulse applied to the other thyristor of said pair of thyristors has been extinguished.

7. A control device for a reverse-conducting GTO thyristor comprising:
a power converter provided with a plurality of pairs of reverse-conducting GTO thyristors;

control means which includes means adapted to apply an ON gate pulse to one thyristor of each of said pairs of reverse-conducting GTO thristors after a lapse of time after starting to supply an OFF gate pulse to the other thyristor of said pair of thyristors necessary for said other thyristor of said pair of thyristors to turn off, and turn on and off each of said pairs of reverse-conducting GTO thyristors in opposite phases; and means for generating said ON gate pulse applied to said one thyristor of each of said pairs of thyristors and said OFF gate pulse applied to the other thyristor of said pair of thyristors in an overlapping time relationship.

8. A control device for a reverse-conducting GTO thyristor comprising:

a direct current power supply;

a 3-phase DC-AC converter which is connected to said said direct current power supply and is provided with three pairs of reverse-conducting GTO thyristors;

a 3-phase induction motor supplied with an AC output from said converter;

control means which includes means adapted to apply an ON gate pulse to one thyristor of each of said pairs of reverse-conducting GTO thyristors after a lapse of time after starting to supply an OFF gate pulse to the other thyristor of said pair of thyristors necessary for said other thyristor of said pair of thyristors to turn off, and turn on and off each of said pairs of reverse-conducting GTO thyristors in opposite phases; and means for continuing said OFF gate pulse until after the generation of said ON gate pulse applied to said one thyristor of each of said pairs of thyristors.

9. The control device for a reverse-conducting GTO thyristor according to claim 8, wherein said control means is a pulse width modulation type of control adapted to turn on and off each of said pairs of reverse-conducting GTO thyristors in opposite phases within a half-cycle period of an AC output from said converter.

* * * * *